US012665489B2

(12) United States Patent
Saxena et al.

(10) Patent No.: US 12,665,489 B2
(45) Date of Patent: Jun. 23, 2026

(54) APPARATUS AND METHOD CONTROLLING PEAK TO PEAK RIPPLE OF CHARGE PUMP OUTPUT VOLTAGE

(71) Applicant: SAMSUNG ELECTRONICS CO., LTD., Suwon-si (KR)

(72) Inventors: Himanshu Saxena, Bangalore (IN); Ankur Gupta, Bangalore (IN); Mukul Agarwal, Bangalore (IN)

(73) Assignee: Samsung Electronics Co., Ltd., Suwon-si (KR)

( * ) Notice: Subject to any disclaimer, the term of this patent is extended or adjusted under 35 U.S.C. 154(b) by 447 days.

(21) Appl. No.: 17/972,858

(22) Filed: Oct. 25, 2022

(65) Prior Publication Data

US 2024/0063709 A1     Feb. 22, 2024

(30) Foreign Application Priority Data

Aug. 18, 2022    (IN) .............................. 202241047140

(51) Int. Cl.
| | |
|---|---|
| *G11C 17/10* | (2006.01) |
| *G11C 5/14* | (2006.01) |
| *G11C 17/18* | (2006.01) |
| *H02M 1/14* | (2006.01) |
| *H02M 3/07* | (2006.01) |

(52) U.S. Cl.
CPC .............. *H02M 1/14* (2013.01); *G11C 5/145* (2013.01); *G11C 17/18* (2013.01); *H02M 3/07* (2013.01)

(58) Field of Classification Search
CPC . H02M 1/14; H02M 3/07; H02M 1/15; G11C 5/145; G11C 17/18
See application file for complete search history.

(56) References Cited

U.S. PATENT DOCUMENTS

| | | | | |
|---|---|---|---|---|
| 5,610,869 | A * | 3/1997 | Yoo ......................... | H02M 3/07 |
| | | | | 365/222 |
| 6,002,630 | A * | 12/1999 | Chuang .................. | G11C 5/147 |
| | | | | 365/230.06 |
| 6,504,422 | B1 | 1/2003 | Rader et al. | |
| 8,547,754 | B2 | 10/2013 | Ha | |
| 2002/0030539 | A1 * | 3/2002 | Sher ................. | G11C 29/12005 |
| | | | | 327/541 |
| 2003/0080955 | A1 * | 5/2003 | Pulvirenti ............ | G09G 3/3696 |
| | | | | 345/212 |
| 2004/0012990 | A1 * | 1/2004 | O .............................. | G11C 5/14 |
| | | | | 365/51 |
| 2007/0252564 | A1 * | 11/2007 | De Nisi .................. | H02M 3/07 |
| | | | | 323/268 |
| 2008/0238536 | A1 * | 10/2008 | Hayashi ................. | G11C 5/145 |
| | | | | 327/535 |
| 2014/0022005 | A1 * | 1/2014 | Ramanan ............... | H02M 3/07 |
| | | | | 327/536 |

OTHER PUBLICATIONS

Office Action in Indian Appln. No. 202241047140, mailed on Mar. 6, 2026, 9 pages.

* cited by examiner

*Primary Examiner* — Uyen Smet
(74) *Attorney, Agent, or Firm* — Fish & Richardson P.C.

(57) ABSTRACT

An apparatus controlling peak-to-peak ripple in an output voltage may include; a charge pump unit configured to generate the output voltage in response to an input supply voltage, and a low voltage detector configured to generate a control signal, wherein the control signal defines the level of the input supply voltage.

18 Claims, 8 Drawing Sheets

FIG. 1

Prior Art

APPARATUS AND METHOD CONTROLLING PEAK TO PEAK RIPPLE OF CHARGE PUMP OUTPUT VOLTAGE

CROSS-REFERENCE TO RELATED APPLICATION(S)

This application claims the benefit under 35 U.S.C. § 119 of Indian Patent Application No. 202241047140, filed on Aug. 18, 2022, the subject matter of which is hereby incorporated by reference in its entirety.

BACKGROUND

The inventive concept relates generally to semiconductor devices, such as semiconductor memory devices. More particularly, the inventive concept relates to apparatuses and methods controlling peak-to-peak ripple of an output voltage provided by a charge pump.

Various apparatuses and methods have been used to control peak-to-peak ripple of an output voltage provided by a charge pump. In this regard, the term "charge pump" is used to denote a charge pump circuit or a charge pump unit configured to provide one or more output voltage(s).

One example of a conventional apparatus 100 used to generate an output voltage exhibiting a controlled peak-to-peak ripple is shown in Figure (FIG. 1. Referring to FIG. 1, the apparatus 100 includes a charge pump unit 102, a pump regulator 104, a voltage controller oscillator (VCO) 106, and a feedback mechanism 108.

The VCO 106 is connected between the charge pump unit 102 and the pump regulator 104. The pump regulator 104 is connected between the VCO 106 and the feedback mechanism 108, and the feedback mechanism 108 is connected between an output voltage (e.g., VPP) provided by the charge pump 102 and the pump regulator 104.

With this configuration, the pump regulator 104 compares a reference voltage (VREF) to a feedback voltage (VFB) received from the feedback mechanism 108 to generate a control voltage (VOSC) provided to the VCO 106. In response to the control voltage received from the pump regulator 104, the VCO 106 generates a multi-phase clock signal or multiple clock signals, each having a respective phase (e.g., CLK1, CLK2, and CLK3) (hereafter generally, a "multi-phase clock signal"). The multiphase clock signal is provided to the charge pump unit 102, and the charge pump unit 102, including one or more charge pump(s), generates the output voltage having controlled peak-to-peak ripple.

Semiconductor memory devices (hereafter, "memory devices") may be generally categorized as volatile or non-volatile according to their operative nature. Volatile memory devices lose stored data in the absence of applied power, whereas non-volatile memory devices are able to retain stored data in the absence of applied power. A one time programmable (OTP) memory is a special type of non-volatile memory that allows data to be written to memory only once.

Referring to FIG. 1, the output voltage generated by the charge pump unit 102 may be used to "break" a gate oxide during a program operation. Further, in order to support programming over a relatively wide range for an input supply voltage (VDDIO), the charge pump unit 102 must support programming current(s) associated with lower input supply voltage(s). Under certain conditions, in order to support a programming current associated with a lower input supply voltage, the capacity of the charge pump unit 102 may require boosting. However, boosting capacity in relation to lower input supply voltages may result in excess capacity in relation to higher input supply voltages, thereby increasing peak-to-peak ripple of the output voltage provided by the charge pump unit 102.

SUMMARY

Apparatuses and methods according to embodiments of the inventive concept control peak-to-peak ripple of a charge pump output voltage.

In this regard, apparatuses and methods according to embodiments of the inventive concept may reduce peak-to-peak ripple of charge pump output voltage. For example, apparatuses and methods according to embodiments of the inventive concept may be used to provide improved control over the generation of a programming voltage applied during a bitcell programming operation. Such improved control over a programming voltage provides more reliable bitcell programming, as well as reduction in peak-to-peak ripple of an output voltage, thereby reducing voltage stress on peripheral electrical circuits and circuitry.

Still further in this regard, apparatuses and methods according to embodiments of the inventive concept provide a voltage detection scheme that may be used in relation to a charge pump, such that improved control over the generation of a programming voltage is achieved.

In one embodiment, the inventive concept provides an apparatus controlling peak-to-peak ripple in an output voltage. The apparatus includes; a feedback mechanism configured to generate a feedback voltage in response to the output voltage, a pump regulator configured to compare the feedback voltage and a reference voltage to generate a control voltage, a voltage control unit configured to generate a multi-phase clock signal in response to the control voltage, a charge pump unit configured to generate the output voltage in response to the multi-phase clock signal and an input supply voltage, and a low voltage detector configured to generate a control signal, wherein the control signal defines the input supply voltage.

In another embodiment, the inventive concept provides an apparatus controlling peak-to-peak ripple in an output voltage. The apparatus includes; a charge pump unit configured to generate the output voltage in response to a level of an input supply voltage, and a low voltage detector configured to generate a control signal, wherein the control signal defines the level of the input supply voltage.

In another embodiment, the inventive concept provides a method controlling peak-to-peak ripple in an output voltage generated by a charge pump unit. The method includes; generating a control signal using a low voltage detector in response to an input supply voltage, defining the input supply voltage to generate a defined input supply voltage, and generating the output voltage in response to the defined input supply voltage.

BRIEF DESCRIPTION OF THE DRAWINGS

Advantages, benefits and features, as well as the making and use of the inventive concept may be better understood upon consideration of the following detailed description together with the accompanying drawings, in which:

FIG. 1 is a circuit diagram illustrating a conventional apparatus controlling peak-to-peak ripple of an output voltage generated by a charge pump;

DETAILED DESCRIPTION

Throughout the written description and drawings, like reference numbers and labels are used to denote like or similar elements, components, features and/or method steps.

Embodiments of the inventive concept provide apparatuses controlling peak-to-peak ripple of an output voltage provided by a charge pump. In some embodiments, an apparatus may include a voltage controlled oscillator (VCO) connected between a charge pump unit and a pump regulator. The pump regulator may be connected between the voltage controller oscillator and a feedback mechanism, and the feedback mechanism may be connected between the pump regulator and the charge pump unit. Further, a low voltage detect circuit (LVD) may be used to generate a control signal selecting between a first circuit component and a second circuit component, wherein the first circuit component and the second circuit component respectively control an input voltage provided to the charge pump unit.

Embodiments of the inventive concept reduce peak-to-peak ripple of the output voltage generated by the charge pump unit, wherein the output voltage (e.g., VPP) may be used during programming of memory cell(s) in a memory device. For example, in some embodiments, the output voltage may be used to program a one-time programmable (OTP) bitcell.

Improved control over the generation of an output voltage (e.g., a voltage used as a programming voltage, such as VPP) provided by embodiments of the inventive concept results in greater reliability of memory cell (or bitcell) programming. Improved control over the generation of an output voltage provided by embodiments of the inventive concept reduces peak-to-peak ripple which reduces voltage stress on peripheral circuitry. Accordingly, apparatuses according to embodiments of the inventive concept require shorter startup times, and may be implemented with relatively smaller physical sizes.

Furthermore, embodiments of the inventive concept reduce a peak-to-peak ripple of an output voltage generated a charge pump unit over a relatively wide input voltage supply range.

Embodiments of the inventive concept provide operating methods for a charge pump unit allowing dynamic adjustment (or change) of an input supply voltage (or an input supply voltage range) in relation to a selection between a first circuit component and a second circuit component.

In some embodiments, apparatuses and methods according to embodiments of the inventive concept may be used to store security keys and/or memory repair information in electronic devices, such as for example; computers, mobile phones, smart phones, Internet of things (IoT) devices, appliances, automobiles, gaming devices, navigation devices, medical devices, security systems, etc.

Figure 2:
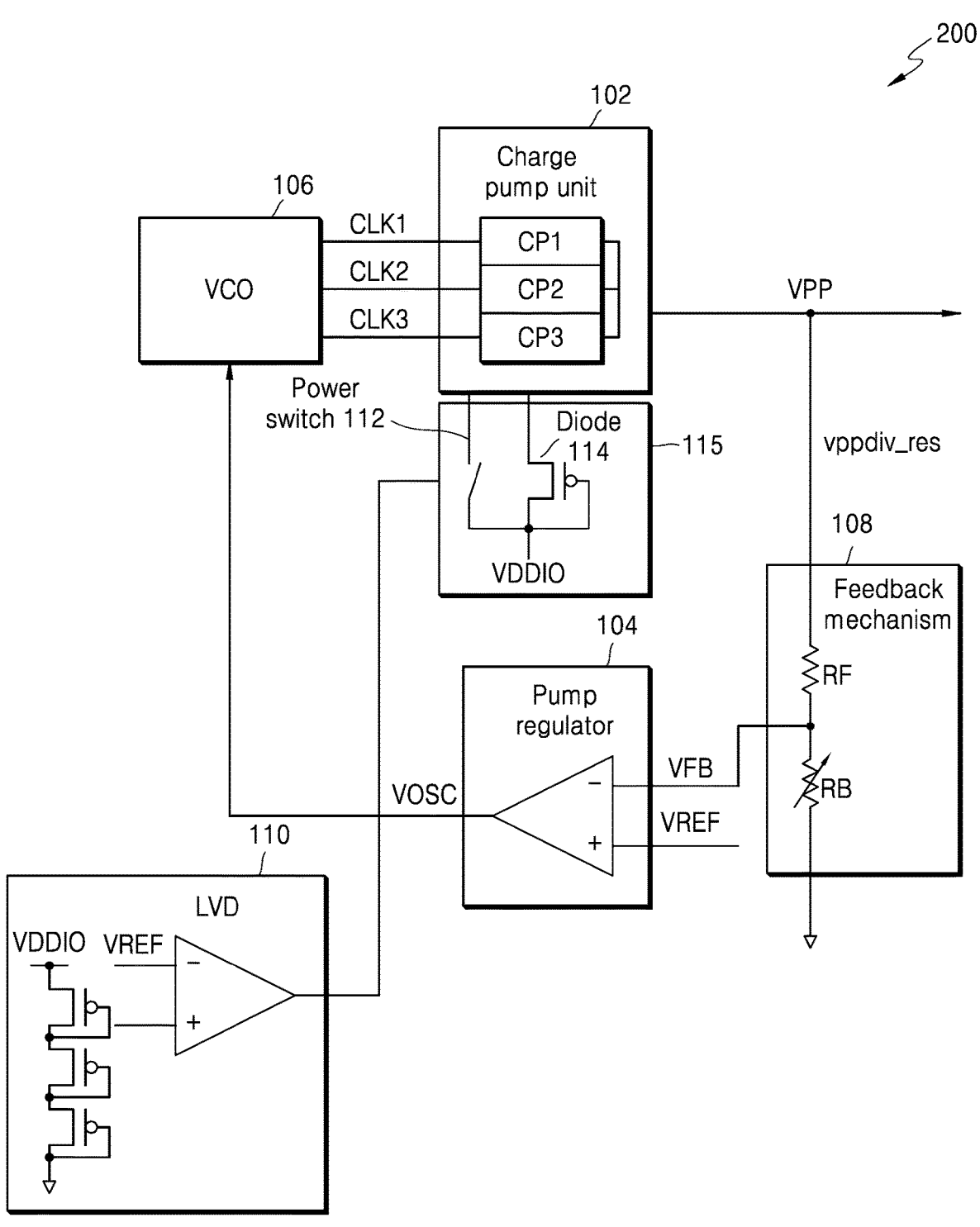
FIG. 2 is a circuit diagram illustrating an apparatus controlling peak-to-peak ripple of an output voltage generated by a charge pump according to embodiments of the inventive concept.

FIG. 2 is a block diagram illustrating an apparatus 200 controlling peak-to-peak ripple of an output voltage generated by a charge pump unit 102 according to embodiments of the inventive concept.

Referring to FIG. 2, the apparatus 200 may include the charge pump unit 102, a pump regulator 104, a voltage control oscillator (VCO) 106, a feedback mechanism 108, a low voltage detect circuit (LVD) 110, a first circuit component 112 and a second circuit component 114. Here, the first circuit component 112 may be, for example, a power switch or a first voltage-controlled resistor, and the second circuit component 114 may be, for example, a diode or a second voltage-controlled resistor. One approach to the operation of the charge pump unit 102 will be described hereafter with reference to FIGS. 4 and 5.

The VCO 106 is connected between the charge pump unit 102 and the pump regulator 104, and receives a control voltage (e.g., VOSC) generated by the pump regulator 104. That is, in response to the control voltage provided by the pump regulator 104, the VCO 106 may generate a multiphase clock signal (e.g., clock signals CLK1, CLK2 and CLK3, each having a respective phase of frequency. The multiphase clock signal may be provided to the charge pump unit 102.

The charge pump unit 102 is connected between the VCO 106 and the feedback mechanism 108, and generates an output voltage (e.g., a programming voltage, VPP). Here, the charge pump unit 102 may be variously configured and may include one or more charge pump circuits.

As may be understood from the foregoing, the charge pump unit 102 is controlled in its operation by the apparatus 200 to reduce peak-to-peak ripple of the output voltage. In this regard, the range of an input supply voltage (VDDIO) provided to the charge pump unit 102 may dynamically adjusted in relation to selection between the first circuit component and the second circuit component.

The pump regulator 104 is connected between the VCO 106 and the feedback mechanism 108. In its operation the pump regulator 104 compares a feedback voltage (VFB) received from the feedback mechanism 108 with a reference voltage (VREF) to generate a control voltage (VOSC) provided to the VCO 106.

The feedback mechanism 108 is connected with the pump regulator 104 and the output voltage generated by the charge pump unit 102. In some embodiments, the feedback mechanism 108 may be implemented as a resistor divider providing the feedback voltage (VFB) to the pump regulator 104.

In some embodiments, the LVD 110 may be connected to a selecting component between the first circuit component and the second circuit component. That is, the LVD 110 may generate a selecting control signal provided to the selecting component (e.g., a switch) selectively connecting either the first circuit component or the second circuit component to the charge pump unit 102. In this regard, each of the first circuit component and the second circuit component may be respectively used to adjust, or not adjust, the level of the input supply voltage VDDIO applied to the charge pump unit 102.

For example, in some embodiments, upon detecting that the level of the input supply voltage VDDIO is low, the LVD 110 may generate the selection control signal to turn ON the first circuit component. Accordingly, the input supply voltage VDDIO (or another predetermined input voltage) may be passed directly (e.g., without level adjustment) to the charge pump 102. However, upon detecting that the input voltage level is high, the LVD 100 may generate the selection control signal to turn OFF the first circuit component. Accordingly, the input supply voltage VDDIO is passed to the charge pump unit 102 with a level adjustment through the second component. In some embodiments, an operational combination of the selecting component, the first circuit component and/or the second circuit component may be referred to as an "input supply voltage adjustment mechanism" 115.

As noted above, in some embodiments, the apparatus 200 may be used to reduce peak-to-peak ripple of the output voltage generated by the charge pump unit 102, wherein the output voltage is used as programming voltage applied to one or more memory cell(s) of a memory device. In this regard, the apparatus 200 may reduce peak-to-peak ripple of the output voltage generated by the charge pump 102 over a relatively wide range for the input supply voltage.

Figure 3:
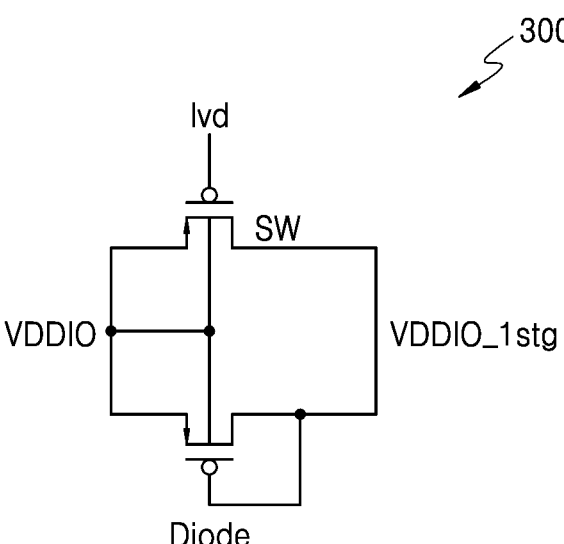
FIG. 3 is a circuit diagram illustrating in one example an input supply voltage adjustment mechanism that may be used in an apparatus according to embodiments of the inventive concept.

FIG. 3 is a circuit diagram 300 illustrating in one example the input supply voltage adjustment mechanism of FIG. 2.

Referring to the FIG. 3, when a default level (lvd) control signal is "low" (e.g., has a relatively low level), the power switch SW will close to connect the input supply voltage VDDIO to a level adjusting voltage (VDDIO_lstg). However, when default level lvd control signal is "high" (e.g., has a relatively high level), the power switch SW will open to disconnect the level adjusting voltage VDDIO_lstg will, thereby reducing the level of the input supply voltage VDDIO according to a diode threshold drop.

Figure 4:
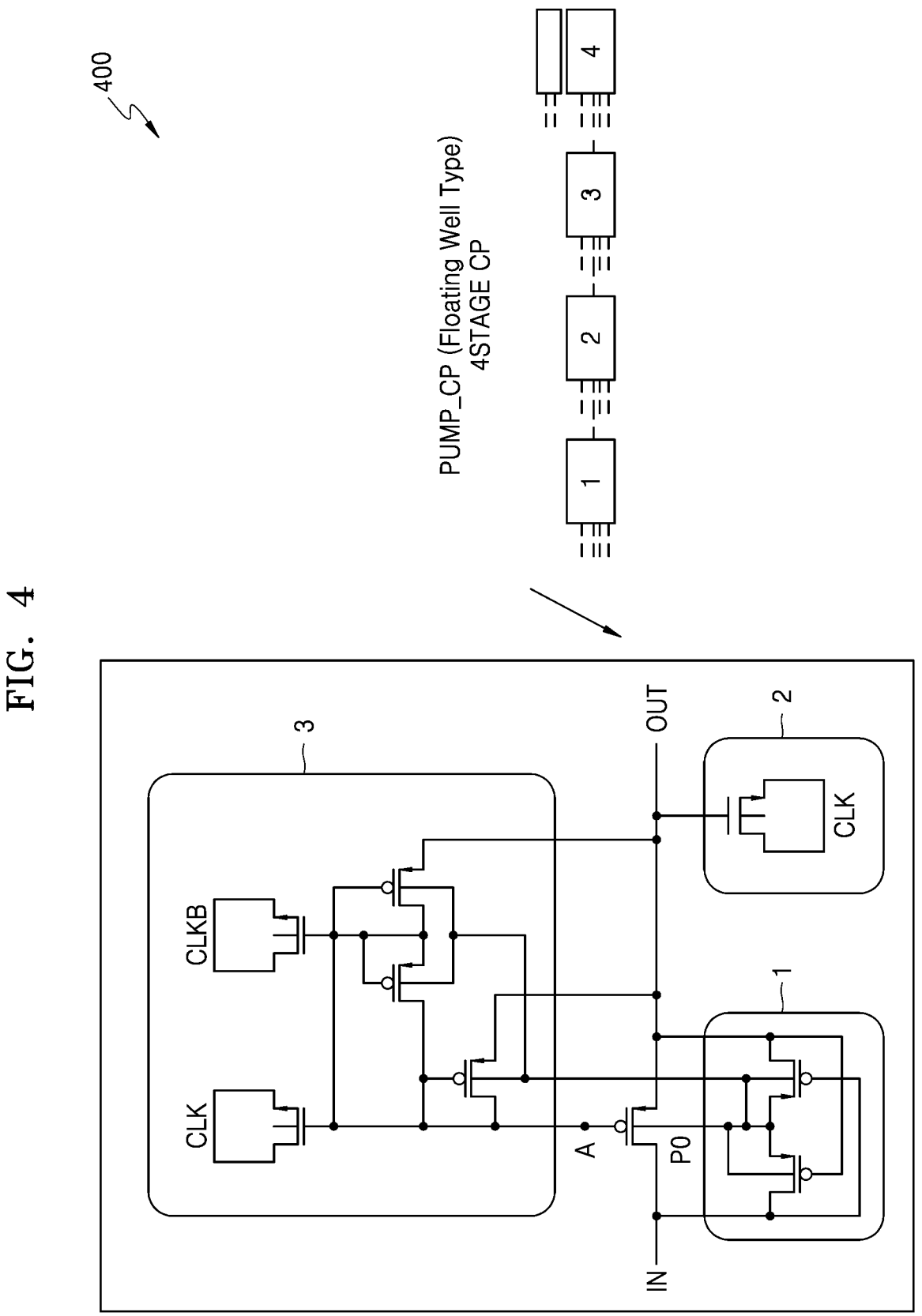
FIGS. 4 and 5 are respective circuit diagrams illustrating charge pump operation.
Figure 5:
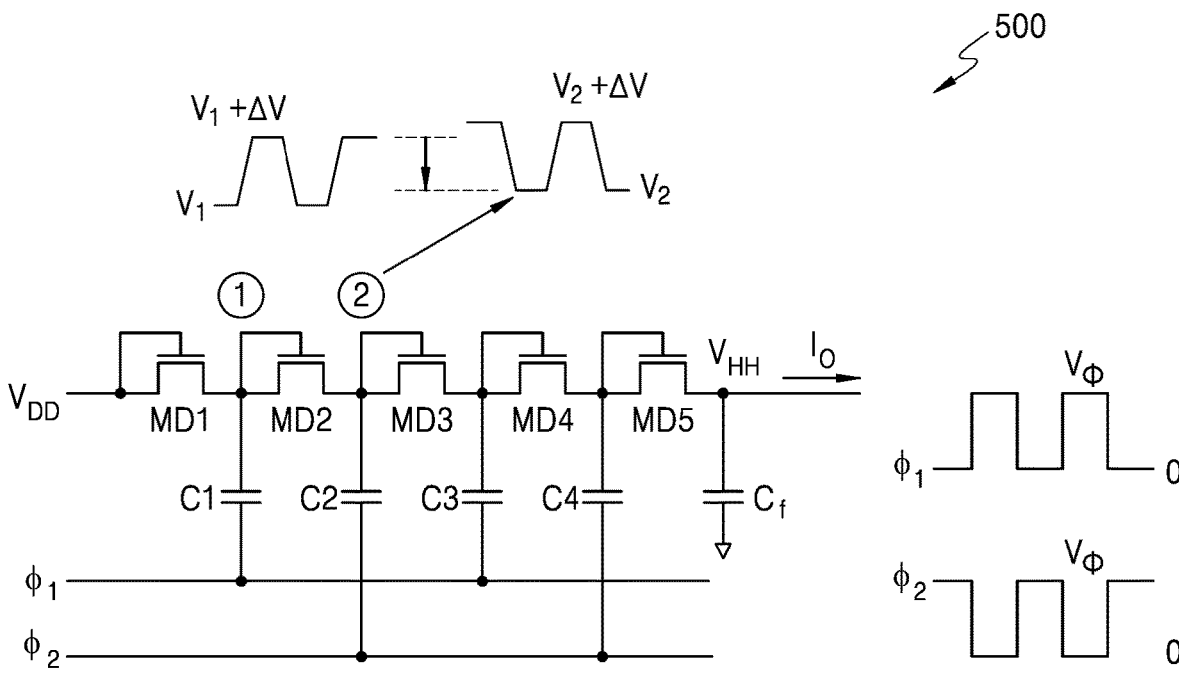

FIGS. 4 and 5 are respective circuit diagrams illustrating charge pump operation.

Figure 1:
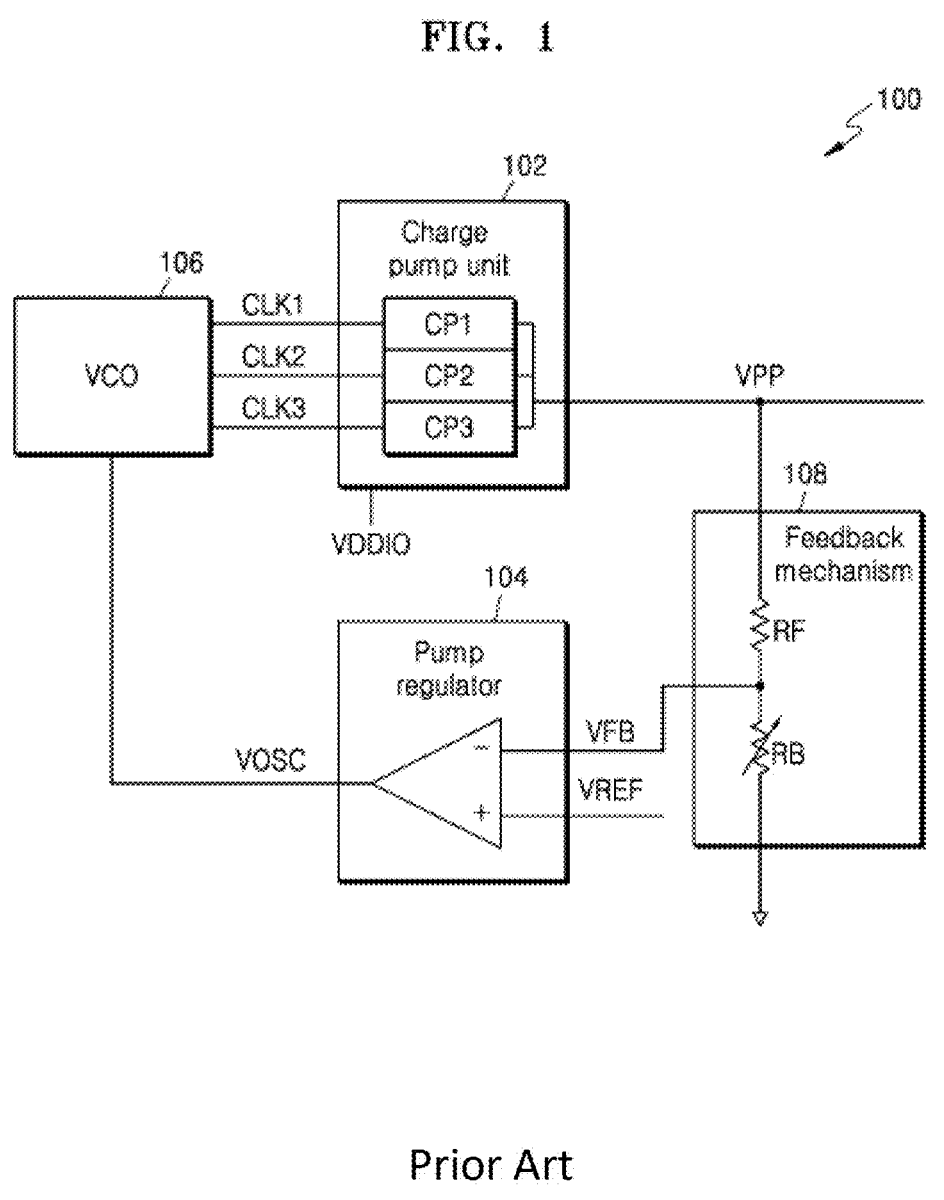

Referring to FIGS. 1, 4 and 5, the charge-pump unit 102 may be understood as having a regulated output ($V_{OUT}$) (e.g., a programming voltage VPP) in relation to a pre-defined load current (Iout). In order to reduce output voltage ripple ($V_R$), an apparatus may increase an output capacitance (Cout) or increase a clock frequency (f). However, increasing the output capacitance Cout would require a greater physical implementation area and this is usually deemed undesirable.

The regulated output voltage $V_{OUT}$ is expressed in [Equation 1], and the output voltage rippler VR is expressed in [Equation 2] that follow:

$$V_{OUT} - V_{IN} = N\left[\left(\frac{C}{C+C_S}\right) \cdot V_\phi - V_D - \frac{I_{OUT}}{(C+C_S)f}\right] - V_D.$$ [Equation 1]

$$V_R = \frac{I_{OUT}}{fC_{OUT}} = \frac{V_{OUT}}{fR_L C_{OUT}}.$$ [Equation 2], wherein, 'N' is a number of charge pump stages (assuming a floating well type charge pump), 'C' is a stage capacitance, 'Cs' is a parasitic capacitance, '$V_\phi$' is a clock voltage level, 'VD' is a voltage drop across a diode in a charge pump stage, and 'Iout' is an output current for the charge pump.

As shown in FIG. 4, the block marked as '1' may be used as a bias floating N-well to establish a highest potential between an input node IN and an output node OUT. The block marked as '2' may be used to establish an Metal-Oxide-Semiconductor (MOS) capacitance for a stage capacitance. The block marked as '3' may be used to bootstrap the gate of a charge transfer device P0 to avoid a voltage threshold $V^{TH}$ drop, and boost the node 'A' so that a full charge may be transferred from the input node IN to the output node OUT, thereby cancelling the voltage threshold $V^{TH}$ effect.

FIG. 5 is a circuit diagram illustrating, as an example, certain working principles associated with a Dickson charge pump. Here, φ1 and φ2 are non-overlapping out-of-phase clock signals applied to a charge pump stage, wherein the circuit of FIG. 5 behaves as the single diode in the circuit diagram of FIG. 4. As a result, the illustrated clocking scheme of FIG. 5 results in the output voltage of the charge pump having ripple.

Yet the charge pump design provides a regulated output voltage that may be controlled using a feedback mechanism (e.g., a clock frequency f controlled through the feedback mechanism). Referring again to Equation 1, it may be understood that $V_{IN}$ and Vφ can be adjusted to change clock frequency if Vout and Iout are pre-defined. Here, VDD and Vφ may have the same voltage level as VDDIO, so as to reduce $V_{IN}$ and/or Vφ and increase clock frequency f.

Figure 6:
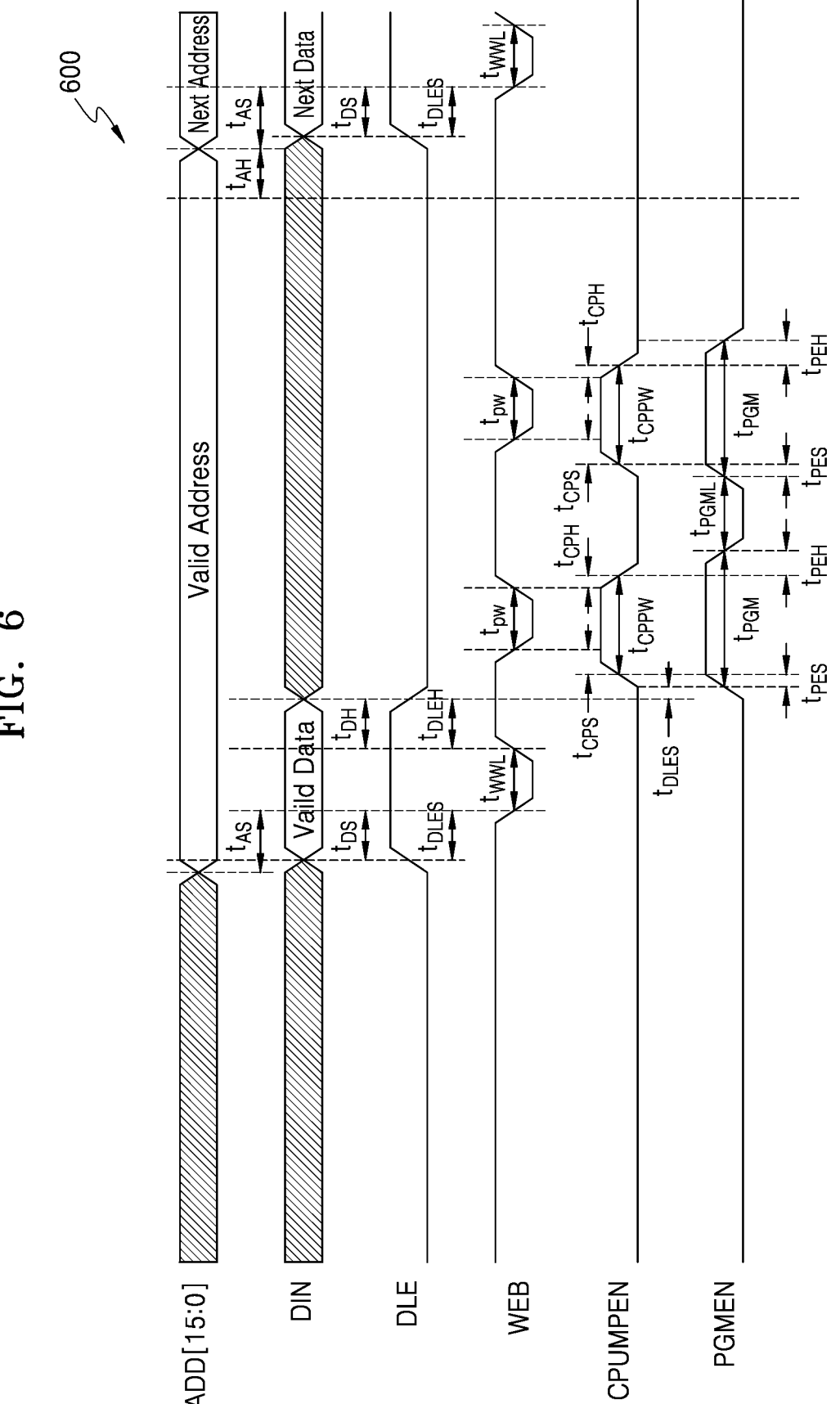
FIG. 6 is a timing diagram illustrating a program operation according to the prior art.

FIG. 6 is a timing diagram illustrating a program operation according to the prior art. Referring to the FIG. 6, a valid address and data are setup before the beginning of the program operation, and a program cycle may start when 'PGMEN' goes high. Accordingly, the charge pump turns ON when 'CPUMPEN' goes high to generate a high programming voltage VPP. In this manner, a bitcell may be programmed by during low pulse(s) of WEB.

Figure 7:
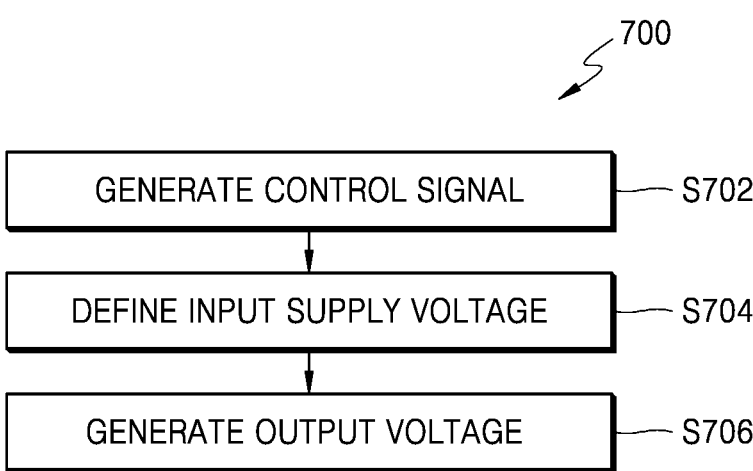
FIGS. 7 and 8 are respective flow charts illustrating methods controlling peak-to-peak ripple in an output voltage generated by a charge pump unit according to embodiments of the inventive concept.
Figure 8:
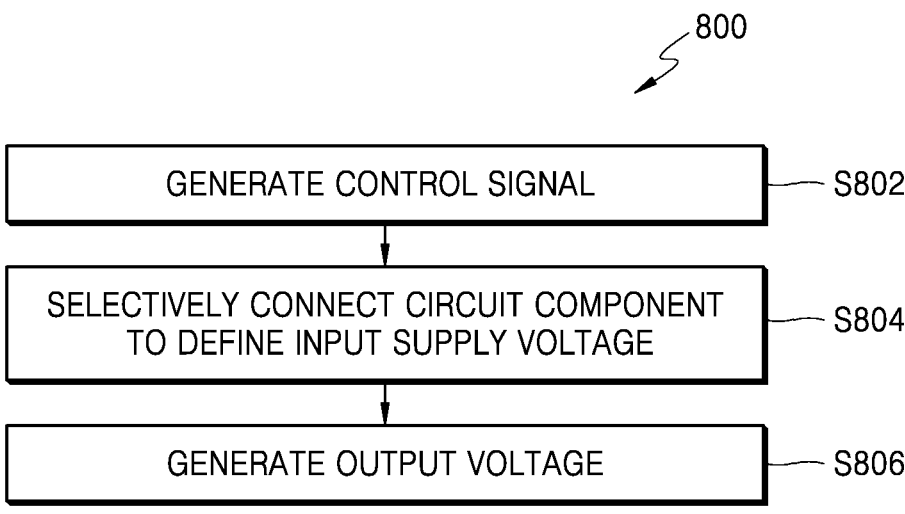

FIGS. 7 and 8 are respective flow charts illustrating methods of controlling peak-to-peak ripple of an output voltage generated by a charge pump according to embodiments of the inventive concept.

Referring to FIG. 7, a method 700 of controlling peak-to-peak ripple of an output voltage generated by a charge pump may include: generating a control signal using a low voltage detector (LVD) (S702); defining an input supply voltage in response to the control signal (S704); and generating the output voltage using the charge pump unit in response to the defined input supply voltage (S706).

In some embodiments, the control signal may be generated by a LVD that compares a reference voltage (VREF) over a relatively wide range of input voltages.

In some embodiments, the input supply voltage may be defined by applying the control signal to an input supply voltage adjustment mechanism which selects between a first circuit component and a second circuit component, wherein the selection between the first circuit component and the second circuit component defines at least a level of the input supply voltage.

In some embodiments, the output voltage may be generated by the charge pump unit in response to the input supply voltage defined by the input supply voltage adjustment mechanism and further in response to a multi-phase clock signal.

Referring to FIG. 8, a method 800 of controlling peak-to-peak ripple of an output voltage generated by a charge pump may include: generating a control signal using a low voltage detector (LVD) (S802); selectively connecting a first circuit component or a second circuit component to the charge pump unit in response to the control signal to define an input supply voltage (S804); and generating the output voltage using the charge pump unit in response to the defined input supply voltage (S806).

In some embodiments, the method 700 or the method 800 may further control peak-to-peak ripple of the output voltage generated by the charge pump in response to the feedback signal (VFB) generated by the feedback mechanism 108 which is connected between the output voltage and the pump regulator 104, wherein the pump regulator 104 generates a control voltage applied to the VCO 106 in response to the feedback signal VFB, and the VCO 106 generates a multi-phase clock signal applied to the charge pump unit 102.

From the foregoing it may be understood that embodiments of the inventive concept may be variously implemented to provide a regulated input supply voltage to a charge pump unit, wherein a level of the input supply voltage may be adjusted by a control signal provided by a low voltage detector (LVD).

The foregoing detail description has been drawn to a number of illustrative embodiments. However, those skilled in the art will recognize that various modifications may be made to the illustrative embodiments without removing the resulting apparatus or method from the scope of the inventive concept, as defined by the following claims.

What is claimed is:

1. An apparatus controlling peak-to-peak ripple in an output voltage, the apparatus comprising:

a feedback mechanism configured to generate a feedback voltage in response to the output voltage;

a pump regulator configured to compare the feedback voltage and a reference voltage to generate a control voltage;

a voltage control unit configured to generate a multi-phase clock signal in response to the control voltage;

a charge pump unit configured to generate the output voltage in response to the multi-phase clock signal and an input supply voltage;

a low voltage detector configured to generate a control signal and detect whether the input supply voltage has a first voltage level or a second voltage level, wherein the second voltage level is greater than the first voltage level; and an input supply voltage adjustment circuit configured to adjust a level of the input supply voltage in response to the control signal, wherein the input supply voltage adjustment circuit includes a first circuit component and a second circuit component, and wherein the second circuit component is configured to reduce the input supply voltage and pass the reduced input supply voltage to the charge pump unit in response to detecting that the input supply voltage has the second voltage level, and wherein the first circuit component is in parallel with the second circuit component.

2. The apparatus of claim 1, wherein the low voltage detector is configured to compare the input supply voltage with the reference voltage and to generate the control signal based on a result of the comparison.

3. The apparatus of claim 1, wherein the input supply voltage adjustment circuit comprises:

a selecting component configured to dynamically adjust the level of the input supply voltage by selecting between the first circuit component and the second circuit component in response to the control signal.

4. The apparatus of claim 1, wherein upon detecting that the input supply voltage has the first voltage level, the low voltage detector is further configured to generate the control signal such that the first circuit component is turned ON, and the input supply voltage is passed directly to the charge pump unit when the first circuit component is turned ON.

5. The apparatus of claim 1, wherein upon detecting that the input supply voltage has the second voltage level, the low voltage detector is further configured to generate the control signal such that the first circuit component is turned OFF, and the input supply voltage is passed to the charge pump unit through the second circuit component when the first circuit component is turned OFF.

6. The apparatus of claim 1, wherein the first circuit component includes at least one of a power switch and a first voltage-controlled resistor.

7. The apparatus of claim 6, wherein the second circuit component includes at least one of a diode and a second voltage-controlled resistor.

8. The apparatus of claim 1, wherein the output voltage is a programming voltage used to program a memory cell of a memory device.

9. The apparatus of claim 1, wherein the charge pump unit includes multiple charge pump stages.

10. An apparatus controlling peak-to-peak ripple in an output voltage, the apparatus comprising:

a charge pump unit configured to generate the output voltage in response to an input supply voltage;

a low voltage detector configured to generate a control signal and detect whether the input supply voltage has a first voltage level or a second voltage level, wherein the second voltage level is greater than the first voltage level; and an input supply voltage adjustment circuit configured to adjust a level of the input supply voltage in response to the control signal, wherein the input supply voltage adjustment circuit includes a first circuit component and a second circuit component, wherein the second circuit component is configured to reduce the input supply voltage and pass the reduced input supply voltage to the charge pump unit in response to detecting that the input supply voltage has the second voltage level, and wherein the first circuit component is in parallel with the second circuit component.

11. The apparatus of claim 10, wherein the input supply voltage adjustment circuit comprises:

a selecting component, configured to dynamically adjust the level of the input supply voltage by selecting between the first circuit component and the second circuit component in response to the control signal.

12. The apparatus of claim 10, wherein upon detecting that the input supply voltage has the first voltage level, the low voltage detector is further configured to generate the control signal such that the first circuit component is turned ON, wherein the input supply voltage is passed directly to the charge pump unit without level adjustment when the first circuit component is turned ON, and upon detecting that the input supply voltage has the second voltage level, the low voltage detector is further configured to generate the control signal such that the first circuit component is turned OFF, wherein the input supply voltage is passed to the charge pump unit through the second circuit component when the first circuit component is turned OFF.

13. A method controlling peak-to-peak ripple in an output voltage generated by a charge pump unit, the method comprising:

generating a control signal using a low voltage detector in response to an input supply voltage;

adjusting, by an input supply voltage adjustment circuit, a level of the input supply voltage to generate a defined input supply voltage; and generating the output voltage in response to the defined input supply voltage wherein generating the control signal using the low voltage detector in response to the input supply voltage comprises detecting whether the input supply voltage has a first voltage level or a second voltage level, wherein the second voltage level is greater than the first voltage level, wherein the input supply voltage adjustment circuit includes a first circuit component and a second circuit component, wherein the second circuit component is configured to reduce the input supply voltage and pass the reduced input supply voltage to the charge pump unit as the defined input supply voltage, and wherein the first circuit component is in parallel with the second circuit component.

14. The method of claim 13, wherein adjusting the level of the input supply voltage to generate the defined input supply voltage includes selecting between the first circuit component and the second circuit component in response to the control signal.

15. The method of claim 13, wherein the generating of the control signal using the low voltage detector in response to the input supply voltage comprises:

upon detecting that the input supply voltage has the first voltage level, generating the control signal such that a first circuit component is turned ON to directly pass the input supply voltage to the charge pump unit without level adjustment, else upon detecting that the input supply voltage has the second voltage level, generating the control signal such that the first circuit component is turned OFF to pass the input supply voltage to the charge pump unit through a second circuit component with level adjustment.

16. The method of claim 13, wherein the first circuit component includes at least one of a power switch and a first voltage-controlled resistor, and the second circuit component includes at least one of a diode and a second voltage-controlled resistor.

17. The method of claim 13, further comprising:

applying the output voltage as a programming voltage to a memory cell of a memory device.

18. The method of claim 13, further comprising:

generating a feedback voltage in response to the output voltage;

comparing the feedback voltage with a reference voltage to generate a control voltage; and generating a multi-phase clock signal in response to the control voltage, wherein the generating of the output voltage is further in response to the multi-phase clock signal.

* * * * *